United States Patent
Sekiya

(10) Patent No.: US 10,930,561 B2
(45) Date of Patent: Feb. 23, 2021

(54) SIC SUBSTRATE PROCESSING METHOD

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/547,044

(22) Filed: Aug. 21, 2019

(65) Prior Publication Data

US 2020/0075415 A1    Mar. 5, 2020

(30) Foreign Application Priority Data

Aug. 29, 2018  (JP) .............................. JP2018-160620

(51) Int. Cl.
| | |
|---|---|
| *H01L 21/78* | (2006.01) |
| *H01L 21/304* | (2006.01) |
| *H01L 21/268* | (2006.01) |
| *H01L 29/16* | (2006.01) |

(52) U.S. Cl.
CPC ........ *H01L 21/7813* (2013.01); *H01L 21/268* (2013.01); *H01L 21/304* (2013.01); *H01L 29/1608* (2013.01)

(58) Field of Classification Search
None
See application file for complete search history.

(56) References Cited

U.S. PATENT DOCUMENTS

| | | | |
|---|---|---|---|
| 2016/0052090 A1* | 2/2016 | Tanigawa | ................ H01L 21/78 219/121.69 |
| 2017/0145591 A1* | 5/2017 | Yoshida | ................ C30B 29/406 |
| 2018/0218896 A1* | 8/2018 | Hirata | ..................... C30B 33/00 |

FOREIGN PATENT DOCUMENTS

JP        2000094221 A      4/2000

* cited by examiner

*Primary Examiner* — Michelle Mandala
(74) *Attorney, Agent, or Firm* — Greer Burns & Crain, Ltd.

(57) ABSTRACT

An SiC substrate processing method includes a separation layer forming step of setting a focal point of a laser beam having a transmission wavelength to SiC inside an SiC substrate and next applying the laser beam to the SiC substrate to thereby form a separation layer inside the SiC substrate, the SiC substrate having a first surface and a second surface opposite to the first surface; a first plate attaching step of attaching a first plate to the first surface of the SiC substrate; a second plate attaching step of attaching a second plate to the second surface of the SiC substrate; and a separating step of applying an external force to the separation layer after performing the first plate attaching step and the second plate attaching step, thereby separating the SiC substrate into a first SiC substrate and a second SiC substrate along the separation layer.

12 Claims, 6 Drawing Sheets

SIC SUBSTRATE PROCESSING METHOD

BACKGROUND OF THE INVENTION

Field of the Invention

The present invention relates to an SiC substrate processing method for producing at least two SiC substrates from a single SiC substrate.

Description of the Related Art

Various devices such as power devices and light-emitting diodes (LEDs) are formed by forming a functional layer on the upper surface of an SiC substrate and partitioning this functional layer into a plurality of separate regions along a plurality of crossing division lines. Thus, the plural devices are separately formed on the upper surface of the SiC substrate to obtain a wafer having the plural devices. The division lines of the wafer having these plural devices are processed by a processing apparatus such as a laser processing apparatus to thereby divide the wafer into a plurality of individual device chips respectively corresponding to the plural devices. The device chips thus obtained are used in control units and automobile parts, for example.

In general, the SiC substrate is produced by slicing a cylindrical SiC ingot with a wire saw. Both sides of the SiC substrate sliced from the SiC ingot are polished to a mirror finish (see JP 2000-94221 A, for example).

SUMMARY OF THE INVENTION

However, when the SiC ingot is cut by the wire saw and both sides of each SiC substrate are polished to obtain the product, a large proportion (70% to 80%) of the SiC ingot is discarded. Since the SiC ingot is expensive, each SiC substrate becomes considerably expensive. As a result, each device chip using the SiC substrate also becomes expensive.

It is therefore an object of the present invention to provide an SiC substrate processing method which can reduce the price of an SiC substrate and can accordingly reduce the price of each device chip.

In accordance with an aspect of the present invention, there is provided an SiC substrate processing method including a separation layer forming step of setting a focal point of a laser beam having a transmission wavelength to SiC inside an SiC substrate and next applying the laser beam to the SiC substrate to thereby form a separation layer inside the SiC substrate, the SiC substrate having a first surface and a second surface opposite to the first surface; a first plate attaching step of attaching a first plate to the first surface of the SiC substrate after performing the separation layer forming step; a second plate attaching step of attaching a second plate to the second surface of the SiC substrate after performing the first plate attaching step; and a separating step of applying an external force to the separation layer after performing the first plate attaching step and the second plate attaching step, thereby separating the SiC substrate into a first SiC substrate and a second SiC substrate along the separation layer.

Preferably, the SiC substrate processing method further includes a flattening step of flattening a rough separation surface of the first SiC substrate attached to the first plate and also flattening a rough separation surface of the second SiC substrate attached to the second plate after performing the separating step, thereby removing roughness from the rough separation surface of the first SiC substrate to obtain a flat surface of the first SiC substrate and also removing roughness from the rough separation surface of the second SiC substrate to obtain a flat surface of the second SiC substrate; and a device forming step of forming devices on the flat surface of the first SiC substrate and also forming devices on the flat surface of the second SiC substrate after performing the flattening step. More preferably, the SiC substrate processing method further includes a plate removing step of removing the first plate from the first SiC substrate and also removing the second plate from the second SiC substrate after performing the device forming step.

More preferably, the SiC substrate processing method further includes the steps of forming a separation layer inside the first SiC substrate after performing the flattening step; attaching a third plate to the flat surface of the first SiC substrate after performing the step of forming the separation layer inside the first SiC substrate; separating the first SiC substrate into a third SiC substrate and a fourth SiC substrate along the separation layer formed inside the first SiC substrate; forming a separation layer inside the second SiC substrate after performing the flattening step; attaching a fourth plate to the flat surface of the second SiC substrate after performing the step of forming the separation layer inside the second SiC substrate; and separating the second SiC substrate into a fifth SiC substrate and a sixth SiC substrate along the separation layer formed inside the second SiC substrate.

According to the present invention, two SiC substrates can be produced from a single SiC substrate. Accordingly, the price of each SiC substrate can be reduced to ½, so that the price of each device chips can also be reduced.

The above and other objects, features, and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
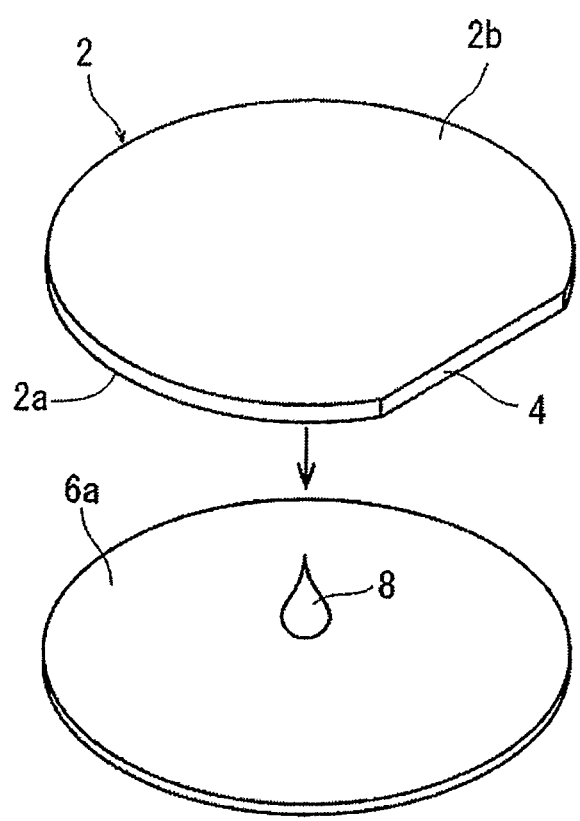
FIG. 1 is a perspective view depicting a first plate attaching step of attaching a first plate to an SiC substrate.

A preferred embodiment of the SiC substrate processing method according to the present invention will now be described with reference to the drawings. FIG. 1 depicts an SiC substrate 2 usable in performing the SiC substrate processing method according to the present invention. As depicted in FIG. 1, the SiC substrate 2 is a substantially circular substrate having an orientation flat 4 on the outer circumference, in which the orientation flat 4 functions to indicate crystal orientation. The SiC substrate 2 has a first surface 2a and a second surface 2b opposite to the first surface 2a. For example, the thickness of the SiC substrate 2 is set to approximately 500 to 700 μm.

As depicted in FIG. 1, a first plate attaching step is first performed to attach a first plate 6a to the first surface 2a of the SiC substrate 2. More specifically, the first plate 6a is attached to the first surface 2a of the SiC substrate 2 by using a suitable adhesive 8 (e.g., polyimide resin adhesive). The first plate 6a is a disk-shaped glass plate having substantially the same diameter as that of the SiC substrate 2. In the condition where the first plate 6a is attached to the first surface 2a of the SiC substrate 2, the adhesive 8 is interposed in the form of a layer between the first plate 6a and the SiC substrate 2. The first plate 6a has a thickness capable of preventing damage to a thinner SiC substrate produced from the original SiC substrate 2 in processing the thinner SiC substrate to form devices in the condition where the thinner SiC substrate is held by the first plate 6a. For example, the thickness of the first plate 6a is set to approximately 500 to 1000 μm.

After performing the first plate attaching step, a separation layer forming step is performed to form a separation layer inside the SiC substrate 2 by applying a laser beam to the SiC substrate 2 in the condition where the focal point of the laser beam is set inside the SiC substrate 2, the laser beam having a transmission wavelength to SiC. As described later, the separation layer is a layer along which the SiC substrate 2 is to be separated into a first SiC substrate and a second SiC substrate. The separation layer forming step may be performed by using a laser processing apparatus 10, a part of which is depicted in FIGS. 2A and 2B.

The laser processing apparatus 10 includes a chuck table 12 for holding a workpiece under suction and focusing means (condenser) 14 having a focusing lens or a condensing lens (not depicted) for focusing a pulsed laser beam LB and applying the pulsed laser beam LB to the workpiece held on the chuck table 12 under suction. The chuck table 12 has an upper surface provided with a circular vacuum chuck 16. The vacuum chuck 16 is formed of a porous material. The vacuum chuck 16 is connected to suction means (not depicted) for producing a suction force. Accordingly, by operating the suction means, the workpiece held on the upper surface of the chuck table 12 is held on the vacuum chuck 16 by the suction force produced by the suction means. The chuck table 12 is rotatable about its vertical axis. Further, the chuck table 12 is movable back and forth both in the X direction indicated by an arrow X in FIGS. 2A and 2B and in the Y direction indicated by an arrow Y in FIGS. 2A and 2B, the Y direction being perpendicular to the X direction. The X direction and the Y direction define a substantially horizontal plane.

Figure 2A:
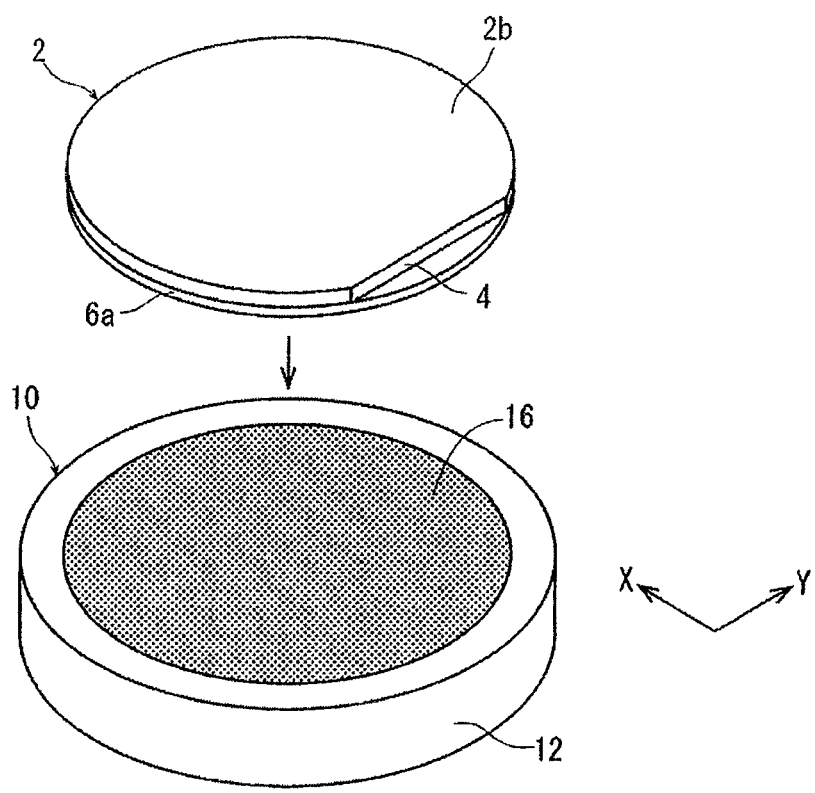
FIG. 2A is a perspective view depicting a manner of placing the SiC substrate attached to the first plate on a chuck table included in a laser processing apparatus.
Figure 2B:
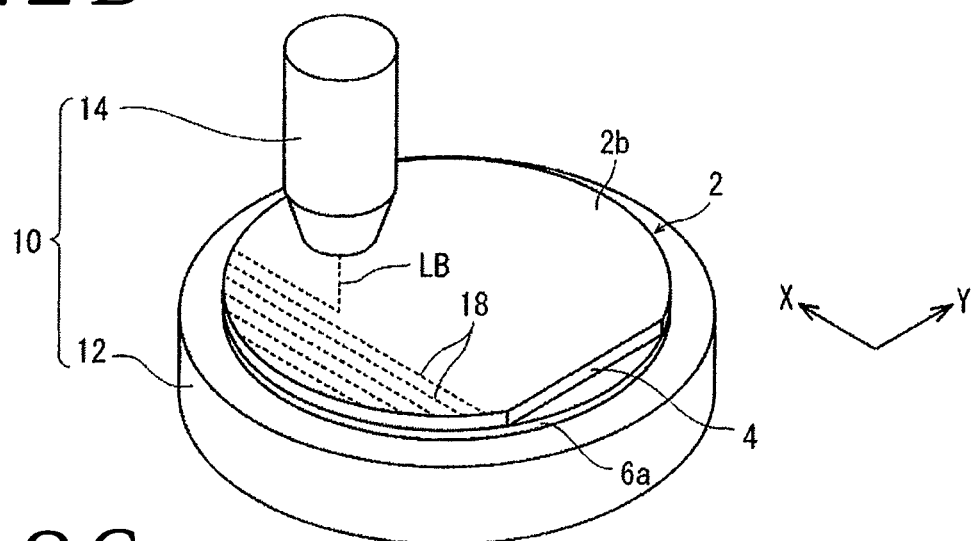
FIG. 2B is a perspective view depicting a separation layer forming step of forming a separation layer inside the SiC substrate attached to the first plate.

In performing the separation layer forming step by using the laser processing apparatus 10, the SiC substrate 2 attached to the first plate 6a is held on the upper surface of the chuck table 12 under suction in the condition where the second surface 2b of the SiC substrate 2 is oriented upward as depicted in FIG. 2A. Thereafter, focal position adjusting means (not depicted) included in the laser processing apparatus 10 is operated to vertically move the focusing means 14, thereby setting the focal point of the pulsed laser beam LB inside the SiC substrate 2. More specifically, the focal point is set at the middle position in the thickness direction of the SiC substrate 2.

Figure 2C:
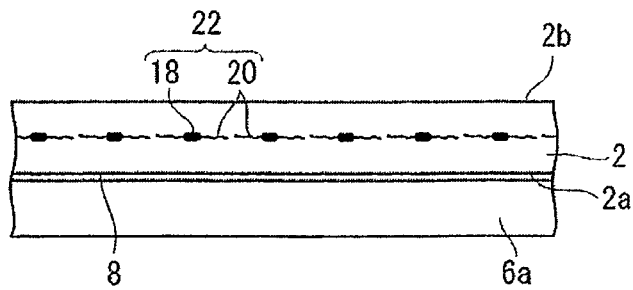
FIG. 2C is a sectional view of the SiC substrate attached to the first plate in the condition where the separation layer has been formed inside the SiC substrate in the separation layer forming step.

Thereafter, the pulsed laser beam LB having a transmission wavelength to SiC is applied from the focusing means 14 to the SiC substrate 2 as moving the chuck table 12 in the X direction at a predetermined feed speed. More specifically, the pulsed laser beam LB is initially applied to the SiC substrate 2 to thereby decompose SiC into Si (silicon) and C (carbon). Thereafter, the pulsed laser beam LB is next applied to the SiC substrate 2 and absorbed by C previously produced. Thus, SiC is decomposed into Si and C in a chain reaction manner with the movement of the chuck table 12 in the X direction to thereby form a plurality of modified portions 18 linearly arranged in the X direction as depicted in FIGS. 2B and 2C. At the same time, a plurality of cracks 20 are formed isotropically from each modified portion 18 as depicted in FIG. 2C. In applying the pulsed laser beam LB to the SiC substrate 2, the focusing means 14 may be moved in the X direction with the chuck table 12 fixed in position.

Thereafter, the chuck table 12 is moved relative to the focal point in the Y direction by a predetermined index amount Li. Thereafter, the pulsed laser beam LB is similarly applied to the SiC substrate 2 as moving the chuck table 12 in the X direction. In this manner, the laser applying operation of applying the pulsed laser beam LB as moving the chuck table 12 in the X direction and the indexing operation of indexing the chuck table 12 in the Y direction are repeated to thereby form a separation layer 22 inside the SiC substrate 2 at the middle position in the thickness direction of the SiC substrate 2 as depicted in FIG. 2C, in which the separation layer 22 is composed of the plural modified portions 18 arranged both in the X direction and in the Y direction and the plural cracks 20 extending from the modified portions 18. Accordingly, the separation layer 22 has a reduced strength by the formation of the modified portions 18 and the cracks 20. While the cracks 20 extending from the adjacent modified portions 18 are spaced as depicted in FIG. 2C for convenience of illustration, the cracks 20 extending from the adjacent modified portions 18 are actually overlapped with each other as viewed in plan. That is, the predetermined index amount Li is set to a value less than the value twice the length of each crack 20. In the above indexing operation, the focusing means 14 may be moved in the Y direction with the chuck table 12 fixed in position. For example, the separation layer forming step may be performed under the following laser processing conditions.

Figure 3:
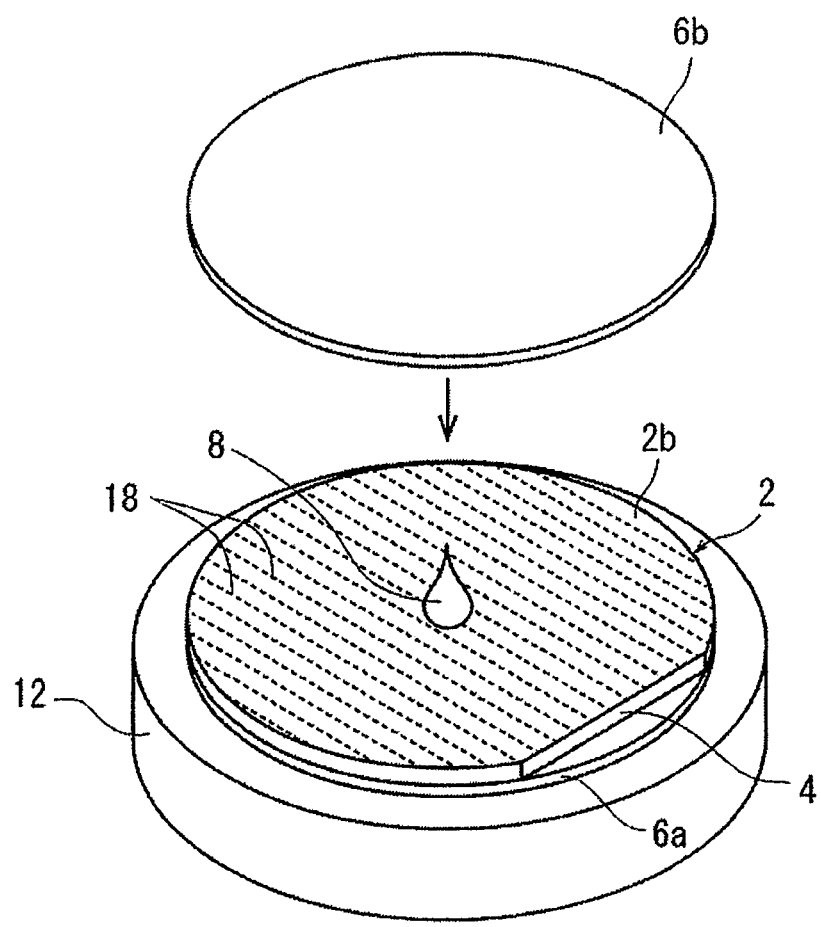
FIG. 3 is a perspective view depicting a second plate attaching step of attaching a second plate to the SiC substrate.

Wavelength of the pulsed laser beam: 1064 nm
Repetition frequency: 80 kHz
Average power: 3.2 W
Pulse width: 4 ns
Spot diameter: 3 μm
Numerical aperture (NA) of the focusing lens: 0.43
Index amount: 250 to 400 μm
Feed speed: 120 to 260 mm/s After performing the separation layer forming step, a second plate attaching step is performed to attach a second plate 6b through a suitable adhesive 8 to the second surface 2b of the SiC substrate 2 as depicted in FIG. 3. In the condition where the second plate 6b is attached to the second surface 2b of the SiC substrate 2, the adhesive 8 is interposed in the form of a layer between the second plate 6b and the SiC substrate 2. The second plate 6b may have the same configuration as that of the first plate 6a.

Figure 4A:
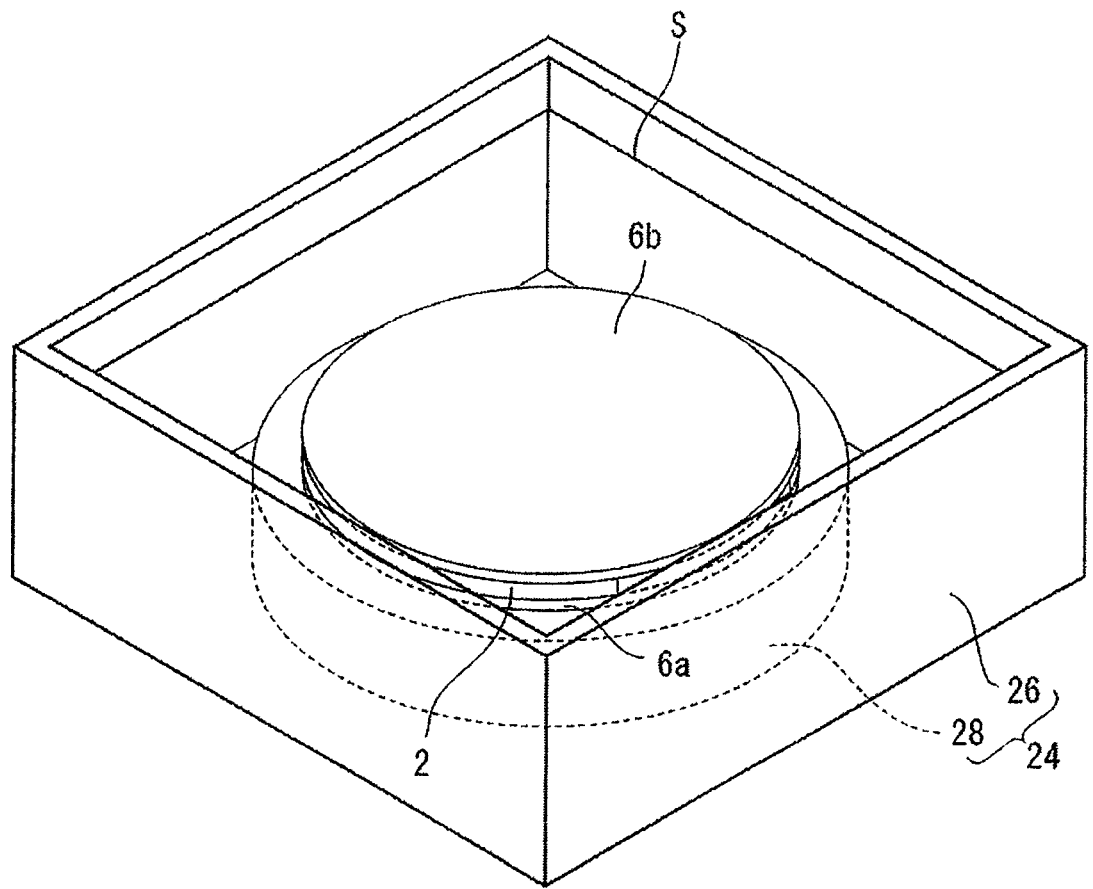
FIG. 4A is a perspective view depicting a separating step of separating the SiC substrate into a first SiC substrate and a second SiC substrate along the separation layer.

After performing the second plate attaching step, a separating step is performed to separate the SiC substrate 2 into a first SiC substrate and a second SiC substrate along the separation layer 22 by applying an external force to the separation layer 22. For example, the separating step may be performed by using a separating apparatus 24 depicted in FIG. 4A. The separating apparatus 24 includes a water tank 26 in which water is stored and an ultrasonic vibrator 28 immersed in the water stored in the water tank 26. In FIG. 4A, the reference symbol S denotes the surface of the water stored in the water tank 26.

Figure 4B:
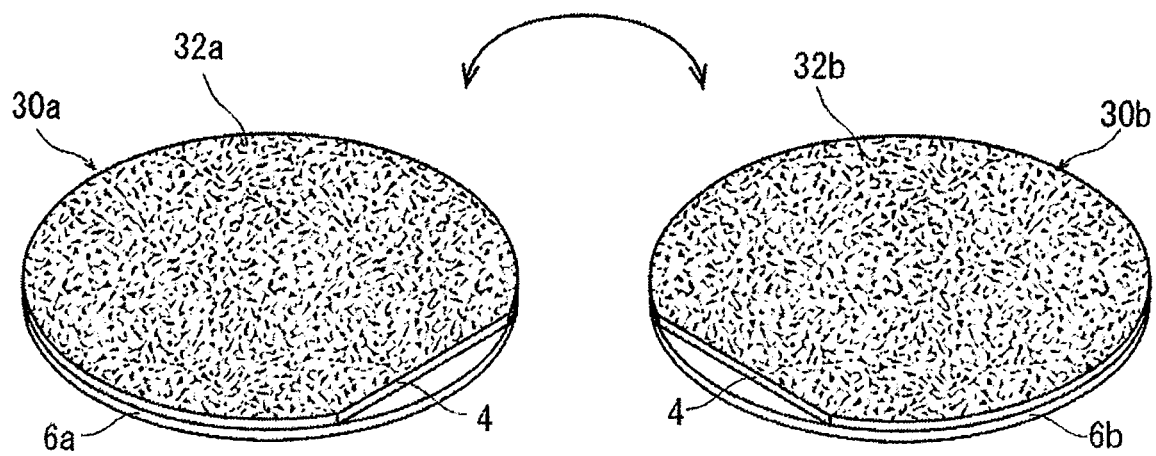
FIG. 4B is a perspective view of the first SiC substrate and the second SiC substrate obtained in the separating step.

In performing the separating step, the SiC substrate 2 is first immersed in the water stored in the water tank 26. Thereafter, the ultrasonic vibrator 28 is operated to apply ultrasonic vibration to the separation layer 22. The ultrasonic vibrator 28 may be formed from a piezoelectric ceramic. In operating the ultrasonic vibrator 28, the ultrasonic vibrator 28 may be kept in contact with the first plate 6a or the second plate 6b or may be spaced from the first plate 6a or the second plate 6b by a suitable distance (e.g., 2 to 3 mm). When the ultrasonic vibrator 28 is operated, the separation layer 22 is stimulated by the ultrasonic vibration and accordingly broken, so that the SiC substrate 2 can be separated into a first SiC substrate 30a and a second SiC substrate 30b (see FIG. 4B) along the separation layer 22 as a separation start point. As a modification, the separating step may be performed by using a wedge-shaped member like a chisel having a thickness gradually reduced to the tip and applying a shock to the separation layer 22.

Figure 5A:
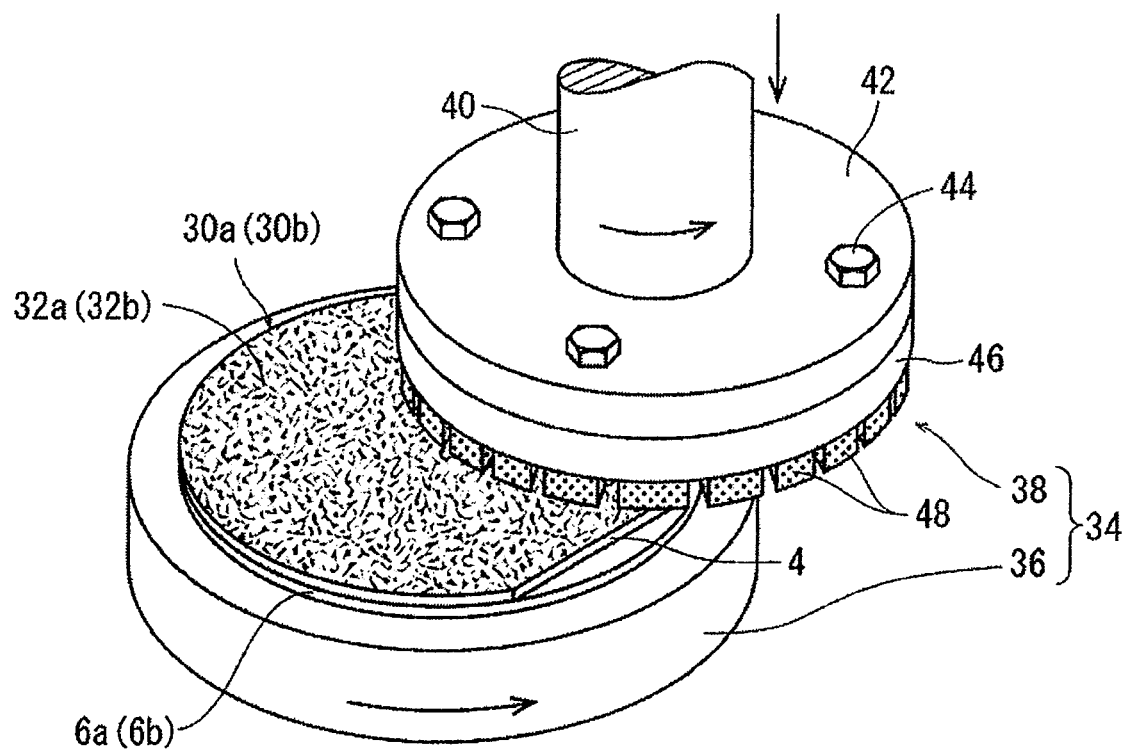
FIG. 5A is a perspective view depicting a flattening step of flattening a separation surface of the first (second) SiC substrate.

After performing the separating step, a flattening step is performed to flatten a separation surface 32a (see FIG. 4B) of the first SiC substrate 30a attached to the first plate 6a and a separation surface 32b (see FIG. 4B) of the second SiC substrate 30b attached to the second plate 6b, the separation surfaces 32a and 32b being rough surfaces obtained by breaking the separation layer 22 in the separating step mentioned above. The flattening step may be performed by using a grinding apparatus 34, a part of which is depicted in FIG. 5A. As depicted in FIG. 5A, the grinding apparatus 34 includes a chuck table 36 for holding a workpiece under suction and grinding means 38 for grinding the workpiece held on the chuck table 36 under suction.

The chuck table 36 has an upper surface as a holding surface for holding the workpiece under suction. The chuck table 36 is rotatable about its vertical axis. The grinding means 38 includes a spindle 40 having a rotation axis extending in a vertical direction, the spindle 40 being connected to a motor (not depicted), and also includes a disk-shaped wheel mount 42 fixed to the lower end of the spindle 40. An annular grinding wheel 46 is fixed to the lower surface of the wheel mount 42 by bolts 44. A plurality of abrasive members 48 are fixed to the lower surface of the grinding wheel 46 so as to be arranged annularly at given intervals along the outer circumference of the grinding wheel 46.

Figure 5B:
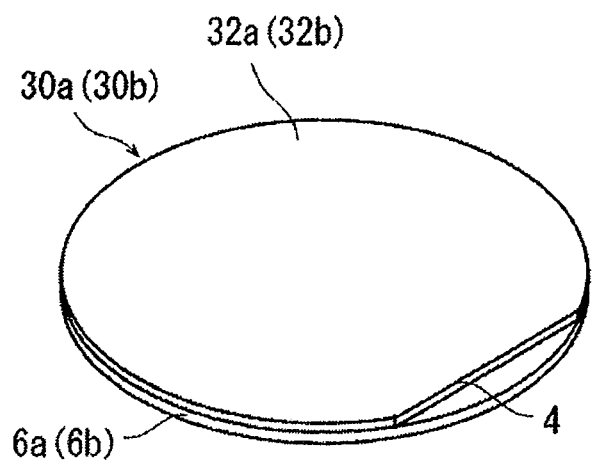
FIG. 5B is a perspective view of the first (second) SiC substrate having the separation surface flattened in the flattening step.

In performing the flattening step by using the grinding apparatus 34, the first SiC substrate 30a attached to the first plate 6a is held on the upper surface of the chuck table 36 under suction in the condition where the separation surface 32a of the first SiC substrate 30a is oriented upward as depicted in FIG. 5A. Thereafter, the chuck table 36 is rotated at a predetermined speed (e.g., 300 rpm) in a counterclockwise direction as viewed in plan. Further, the spindle 40 is rotated at a predetermined speed (e.g., 6000 rpm) in a counterclockwise direction as viewed in plan. Thereafter, the spindle 40 is lowered by elevating means (not depicted) included in the grinding apparatus 34 until the abrasive members 48 fixed to the grinding wheel 46 come into contact with the separation surface 32a of the first SiC substrate 30a. Thereafter, the spindle 40 is further lowered at a predetermined feed speed (e.g., 0.1 μm/s) to thereby grind the separation surface 32a of the first SiC substrate 30a. Thus, the separation surface 32a of the first SiC substrate 30a attached to the first plate 6a can be flattened by grinding as depicted in FIG. 5B. In other words, the roughness of the separation surface 32a can be removed to obtain a flat surface. Similarly, the separation surface 32b of the second SiC substrate 30b attached to the second plate 6b can be flattened by grinding, thereby obtaining a flat surface.

Figure 6:
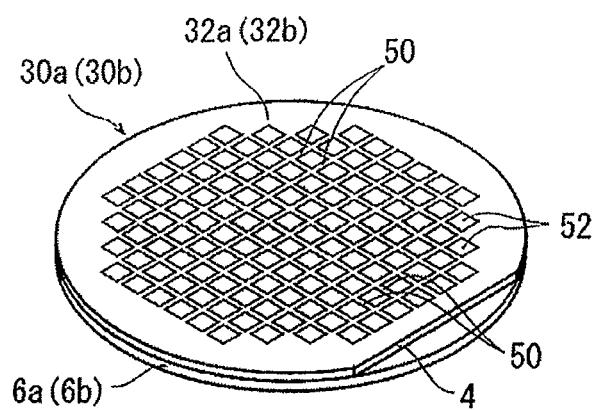
FIG. 6 is a perspective view of the first (second) SiC substrate in the condition where devices have been formed on the first (second) SiC substrate in a device forming step.

After performing the flattening step, a device forming step is performed to form devices on the flat separation surface 32a of the first SiC substrate 30a and to similarly form devices on the flat separation surface 32b of the second SiC substrate 30b. As depicted in FIG. 6, a plurality of crossing division lines 50 are formed on the flat separation surface 32a of the first SiC substrate 30a and on the flat separation surface 32b of the second SiC substrate 30b to thereby define a plurality of rectangular separate regions. In these plural separate regions, a plurality of devices 52 such as power devices and LEDs are respectively formed. In this device forming step, the first plate 6a is kept attached to the first SiC substrate 30a, and the second plate 6b is kept attached to the second SiC substrate 30b. Accordingly, in processing the first SiC substrate 30a and the second SiC substrate 30b in this device forming step, possible damage to the first and second SiC substrates 30a and 30b can be suppressed by the first and second plates 6a and 6b.

Figure 7A:
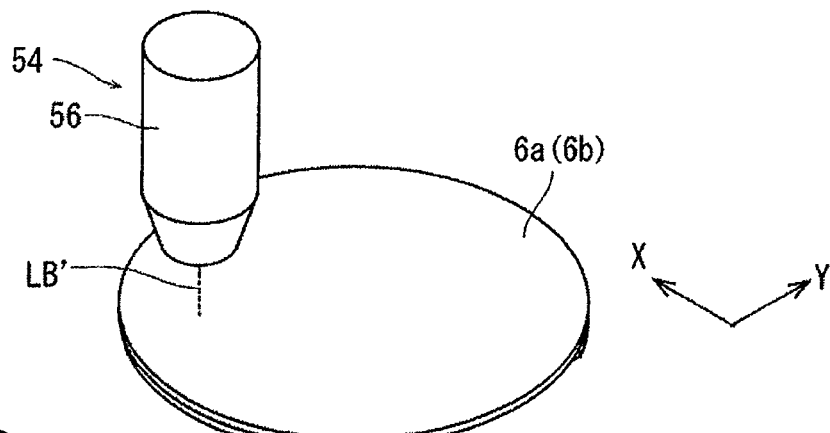
FIG. 7A is a perspective view depicting a plate removing step of removing the first (second) plate from the first (second) SiC substrate.

After performing the device forming step, a plate removing step is performed to remove the first plate 6a from the first SiC substrate 30a and also remove the second plate 6b from the second SiC substrate 30b. The plate removing step may be performed by using a laser processing apparatus 54, a part of which is depicted in FIG. 7A. The laser processing apparatus 54 includes a chuck table (not depicted) for holding a workpiece under suction and focusing means 56 having a focusing lens (not depicted) for focusing a pulsed laser beam LB' and applying the pulsed laser beam LB' to the workpiece held on the chuck table under suction. The chuck table has an upper surface as a holding surface for holding the workpiece under suction. The chuck table is movable back and forth both in the X direction indicated by an arrow X in FIG. 7A and in the Y direction indicated by an arrow Y in FIG. 7A.

Figure 7B:
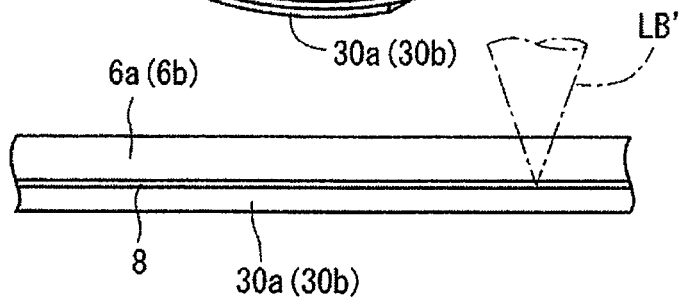
FIG. 7B is a sectional view depicting the plate removing step depicted in FIG. 7A.
Figure 7C:
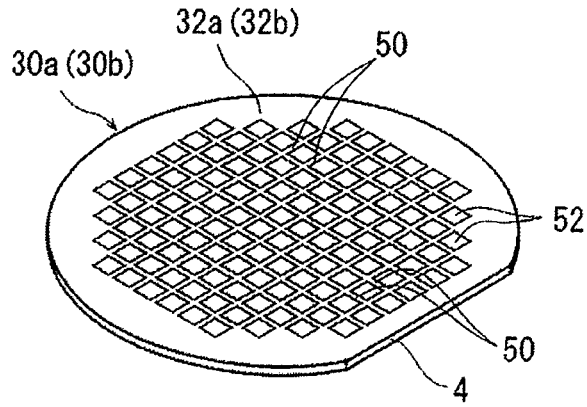
FIG. 7C is a perspective view of the first (second) SiC substrate in the condition where the first (second) plate has been removed from the first (second) SiC substrate in the plate removing step.

In performing the plate removing step by using the laser processing apparatus 54, the first SiC substrate 30a attached to the first plate 6a is first held on the upper surface of the chuck table under suction in the condition where the first plate 6a is oriented upward as depicted in FIGS. 7A to 7C. Thereafter, focal position adjusting means (not depicted) included in the laser processing apparatus 54 is operated to vertically move the focusing means 56, thereby setting the focal point of the pulsed laser beam LB' at a predetermined depth corresponding to the adhesive layer 8 bonding the first plate 6a and the first SiC substrate 30a. Thereafter, the pulsed laser beam LB' is applied from the focusing means 56 to the adhesive layer 8 as moving the chuck table in the X direction at a predetermined feed speed. By applying the pulsed laser beam LB' to the adhesive layer 8, the adhesive layer 8 is broken along one line extending in the X direction. Thereafter, the chuck table is moved in the Y direction by a predetermine index amount, and the pulsed laser beam LB' is then similarly applied to the adhesive layer 8 along another line extending in the X direction. In this manner, the laser applying operation and the indexing operation are suitably repeated to fully break the adhesive layer 8 to such a degree that the first plate 6a can be removed from the first SiC substrate 30a. Thereafter, the first plate 6a is removed from the first SiC substrate 30a to thereby obtain the first SiC substrate 30a having the devices 52 as depicted in FIG. 7C. Similarly, the second plate 6b can be removed from the second SiC substrate 30b to thereby obtain the second SiC substrate 30b having the devices 52 as depicted in FIG. 7C. In applying the pulsed laser beam LB' to the adhesive layer 8 and in performing the indexing operation, the focusing means 56 may be moved with the chuck table fixed in position. For example, this plate removing step may be performed under the following laser processing conditions.

Wavelength of the pulsed laser beam: 355 nm
Repetition frequency: 80 kHz
Average power: 1.5 W
Pulse width: 4 ns
Spot diameter: 3 μm
Numerical aperture (NA) of the focusing lens: 0.43
Index amount: 100 μm
Feed speed: 240 mm/s As described above, the first SiC substrate 30a and the second SiC substrate 30b can be produced from the single SiC substrate 2. Accordingly, the price of each SiC substrate can be reduced to ½, and the price of each device chip can also be reduced. Further, the first plate 6a is attached to the first SiC substrate 30a, and the second plate 6b is attached to the second SiC substrate 30b. Accordingly, possible damage to the first SiC substrate 30a and the second SiC substrate 30b in the device forming step can be suppressed.

In this preferred embodiment, the device forming step is performed after performing the flattening step to form the devices 52 on the first SiC substrate 30a and the second SiC substrate 30b. As a modification, the separation layer forming step, the second plate attaching step, and the separating step may be performed after performing the flattening step to process the first SiC substrate 30a or the second SiC substrate 30b, thereby separating the first SiC substrate 30a into two SiC substrates or separating the second SiC substrate 30b into two SiC substrates. In this case, two or more SiC substrates can be produced from the original SiC substrate 2.

Further, while the separation layer forming step is performed after performing the first plate attaching step in this preferred embodiment, the first plate attaching step may be performed after performing the separation layer forming step. As another modification, the separation layer forming step may be performed after performing the first plate attaching step and the second plate attaching step. In this case, it is necessary that the first plate or the second plate can transmit the wavelength (e.g., 1064 nm in this preferred embodiment) of the pulsed laser beam in the separation layer forming step. For example, glass is preferable as the material of the first plate or the second plate.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. An SiC substrate processing method comprising:
a separation layer forming step of setting a focal point of a laser beam having a transmission wavelength to SiC inside an SiC substrate and next applying the laser beam to the SiC substrate to thereby form a separation layer inside the SiC substrate, the SiC substrate having a first surface and a second surface opposite to the first surface;
a first plate attaching step of attaching a first plate to the first surface of the SiC substrate after performing the separation layer forming step, wherein said first plate comprises a disk-shaped glass plate;
a second plate attaching step of attaching a second plate to the second surface of the SiC substrate after performing the first plate attaching step; and
a separating step of applying an external force to the separation layer after performing the first plate attaching step and the second plate attaching step, thereby separating the SiC substrate into a first SiC substrate and a second SiC substrate along the separation layer.

2. The SiC substrate processing method according to claim 1, further comprising:
a flattening step of flattening a rough separation surface of the first SiC substrate attached to the first plate and also flattening a rough separation surface of the second SiC substrate attached to the second plate after performing the separating step, thereby removing roughness from the rough separation surface of the first SiC substrate to obtain a flat surface of the first SiC substrate and also removing roughness from the rough separation surface of the second SiC substrate to obtain a flat surface of the second SiC substrate; and
a device forming step of forming devices on the flat surface of the first SiC substrate and also forming devices on the flat surface of the second SiC substrate after performing the flattening step.

3. The SiC substrate processing method according to claim 2, further comprising:
a plate removing step of removing the first plate from the first SiC substrate and also removing the second plate from the second SiC substrate after performing the device forming step.

4. The SiC substrate processing method according to claim 2, further comprising the steps of:
forming a separation layer inside the first SiC substrate after performing the flattening step;
attaching a third plate to the flat surface of the first SiC substrate after performing the step of forming the separation layer inside the first SiC substrate;
separating the first SiC substrate into a third SiC substrate and a fourth SiC substrate along the separation layer formed inside the first SiC substrate;
forming a separation layer inside the second SiC substrate after performing the flattening step;
attaching a fourth plate to the flat surface of the second SiC substrate after performing the step of forming the separation layer inside the second SiC substrate; and separating the second SiC substrate into a fifth SiC substrate and a sixth SiC substrate along the separation layer formed inside the second SiC substrate.

5. The SiC substrate processing method according to claim 1, wherein said second plate comprises a disk-shaped glass plate.

6. The SiC substrate processing method according to claim 1, wherein said first plate attaching step involves using an adhesive to attach said first plate to the first surface of the SiC substrate.

7. The SiC substrate processing method according to claim 1, wherein said first plate has a thickness of between approximately 500 µm and approximately 1000 µm.

8. The SiC substrate processing method according to claim 1, wherein said first plate has an outer diameter that is substantially the same as an outer diameter of said SiC substrate.

9. The SiC substrate processing method according to claim 6, further comprising:
  a flattening step of flattening a rough separation surface of the first SiC substrate attached to the first plate and also flattening a rough separation surface of the second SiC substrate attached to the second plate after performing the separating step, thereby removing roughness from the rough separation surface of the first SiC substrate to obtain a flat surface of the first SiC substrate and also removing roughness from the rough separation surface of the second SiC substrate to obtain a flat surface of the second SiC substrate;
  a device forming step of forming devices on the flat surface of the first SiC substrate and also forming devices on the flat surface of the second SiC substrate after performing the flattening step; and
  a plate removing step of removing the first plate from the first SiC substrate and also removing the second plate from the second SiC substrate after performing the device forming step,
  wherein said plate removing step comprises directing a focal point of a pulsed laser beam to a depth corresponding to a layer formed by the adhesive of said first plate attaching step to thereby break the layer of adhesive.

10. An SiC substrate processing method comprising:
  a separation layer forming step of setting a focal point of a laser beam having a transmission wavelength to SiC inside an SiC substrate and next applying the laser beam to the SiC substrate to thereby form a separation layer inside the SiC substrate, the SiC substrate having a first surface and a second surface opposite to the first surface;
  a first plate attaching step of attaching a first plate to the first surface of the SiC substrate after performing the separation layer forming step, wherein said first plate comprises a disk-shaped plate, and further wherein said first plate has a thickness of between approximately 500 µm and approximately 1000 µm;
  a second plate attaching step of attaching a second plate to the second surface of the SiC substrate after performing the first plate attaching step; and
  a separating step of applying an external force to the separation layer after performing the first plate attaching step and the second plate attaching step, thereby separating the SiC substrate into a first SiC substrate and a second SiC substrate along the separation layer.

11. The SiC substrate processing method according to claim 10, wherein said first plate attaching step involves using an adhesive to attach said first plate to the first surface of the SiC substrate.

12. The SiC substrate processing method according to claim 11, further comprising:
  a flattening step of flattening a rough separation surface of the first SiC substrate attached to the first plate and also flattening a rough separation surface of the second SiC substrate attached to the second plate after performing the separating step, thereby removing roughness from the rough separation surface of the first SiC substrate to obtain a flat surface of the first SiC substrate and also removing roughness from the rough separation surface of the second SiC substrate to obtain a flat surface of the second SiC substrate;
  a device forming step of forming devices on the flat surface of the first SiC substrate and also forming devices on the flat surface of the second SiC substrate after performing the flattening step; and
  a plate removing step of removing the first plate from the first SiC substrate and also removing the second plate from the second SiC substrate after performing the device forming step,
  wherein said plate removing step comprises directing a focal point of a pulsed laser beam to a depth corresponding to a layer formed by the adhesive of said first plate attaching step to thereby break the layer of adhesive.

* * * * *